United States Patent
Lim et al.

(10) Patent No.: US 9,941,373 B2
(45) Date of Patent: Apr. 10, 2018

(54) METAL GATE STRUCTURE

(71) Applicant: Taiwan Semiconductor Manufacturing Company, Ltd., Hsin-Chu (TW)

(72) Inventors: Peng-Soon Lim, Kluang (MY); Da-Yuan Lee, Jhubei (TW); Kuang-Yuan Hsu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/253,383

(22) Filed: Aug. 31, 2016

(65) Prior Publication Data
US 2016/0372563 A1    Dec. 22, 2016

Related U.S. Application Data

(60) Continuation of application No. 14/727,162, filed on Jun. 1, 2015, now Pat. No. 9,449,832, which is a division of application No. 13/214,996, filed on Aug. 22, 2011, now Pat. No. 9,048,334.

(51) Int. Cl.
| | |
|---|---|
| *H01L 21/28* | (2006.01) |
| *H01L 29/423* | (2006.01) |
| *H01L 21/8234* | (2006.01) |
| *H01L 29/49* | (2006.01) |
| *H01L 21/285* | (2006.01) |
| *H01L 21/311* | (2006.01) |
| *H01L 29/51* | (2006.01) |

(52) U.S. Cl.
CPC ...... *H01L 29/42376* (2013.01); *H01L 21/285* (2013.01); *H01L 21/2855* (2013.01); *H01L 21/28114* (2013.01); *H01L 21/28247* (2013.01); *H01L 21/31105* (2013.01); *H01L 21/823456* (2013.01); *H01L 29/4236* (2013.01); *H01L 29/4966* (2013.01); *H01L 29/513* (2013.01); *H01L 29/517* (2013.01)

(58) Field of Classification Search
CPC ... H01L 21/28; H01L 21/4234; H01L 21/285; H01L 21/28114; H01L 21/28247; H01L 21/2855; H01L 21/31105; H01L 21/823456
USPC ........................................................ 438/591
See application file for complete search history.

(56) References Cited

U.S. PATENT DOCUMENTS

| | | | |
|---|---|---|---|
| 5,960,270 A | 9/1999 | Misra et al. | |
| 6,492,267 B1 | 12/2002 | Yin et al. | |
| 2006/0065939 A1* | 3/2006 | Doczy | H01L 21/823828 257/412 |
| 2006/0289929 A1* | 12/2006 | Andrews | H01L 29/66734 257/330 |
| 2010/0124818 A1 | 5/2010 | Lee et al. | |

(Continued)

*Primary Examiner* — Chuong A Luu
(74) *Attorney, Agent, or Firm* — Slater Matsil, LLP

(57) ABSTRACT

A device comprises a metal gate structure over a substrate, wherein the metal gate structure comprises a first metal sidewall, a metal bottom layer, a first corner portion between the first metal sidewall and the metal bottom layer, wherein the first corner portion comprises a first step and a first ramp, a second metal sidewall and a second corner portion between the second metal sidewall and the metal bottom layer, wherein the second corner portion comprises a second step and a second ramp.

20 Claims, 4 Drawing Sheets

(56) References Cited

U.S. PATENT DOCUMENTS

2011/0195570 A1    8/2011   Lin et al.
2012/0049247 A1    3/2012   Lee et al.

* cited by examiner

METAL GATE STRUCTURE

This is a continuation application of U.S. patent application Ser. No. 14/727,162, entitled "Metal Gate Structure" which was filed on Jun. 1, 2015 now U.S. Pat. No. 9,449,832 which is a divisional of U.S. patent application Ser. No. 13/214,996, entitled "Metal Gate Structure" which was filed on Aug. 22, 2011 now U.S. Pat. No. 9,048,334 and issued as U.S. Pat. No. 9,048,334 on Jun. 2, 2015, both of which are incorporated herein by reference.

BACKGROUND

Since the invention of the integrated circuit, the semiconductor industry has experienced rapid growth due to improvements in the integration density of a variety of electronic components (e.g., transistors, diodes, resistors, capacitors, etc.). This improvement in integration density has come from shrinking the semiconductor process node (e.g., shrink the process node towards the sub-20 nm node). As the demand for miniaturization continues, the further shrinking of the process node may increase the complexity of fabricating integrated circuits.

An integrated circuit may comprise a variety of metal oxide semiconductor (MOS) devices. Each MOS device may comprise a substrate layer. A dielectric layer such as a layer of silicon dioxide may be formed on top of the substrate layer. Furthermore, a conductive layer such as a layer of metal or polycrystalline silicon may be deposited on top of the dielectric layer to form a gate structure of the MOS device. In addition, the MOS device may comprise a drain region and a source region. Both regions are highly doped with the same type doping, such as a p-type doping or an n-type doping. Both regions are further connected to two metal contacts to form a drain terminal and a source terminal respectively.

The gate of a MOS device can be formed of either polycrystalline silicon or metal. As semiconductor technologies evolve, MOS devices having a metal gate structure have emerged as an effective solution to further improve the performance of MOS devices. For example, the metal gate structure can reduce the resistance of a gate terminal so as to improve the propagation delay when a gate signal passes through the gate terminal. A variety of metal materials such as tantalum nitride, metal carbide, tantalum, titanium and/or the like can be used to form the gate structure of MOS devices.

Various technologies can be employed to deposit metal materials to form a metal gate structure. Metal materials can be deposited on top of a dielectric layer through a chemical vapor deposition (CVD) process. Alternatively, a metal layer can be formed by a physical vapor deposition (PVD) process. During a PVD process, metal materials are sputtered or vaporized and deposited on the surface of a wafer. The PVD process mainly employs physical processes such as vacuum evaporation or plasma sputter bombardment.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, a metal gate structure for a metal oxide semiconductor (MOS) device. The invention may also be applied, however, to a variety of semiconductor devices.

Figure 1:
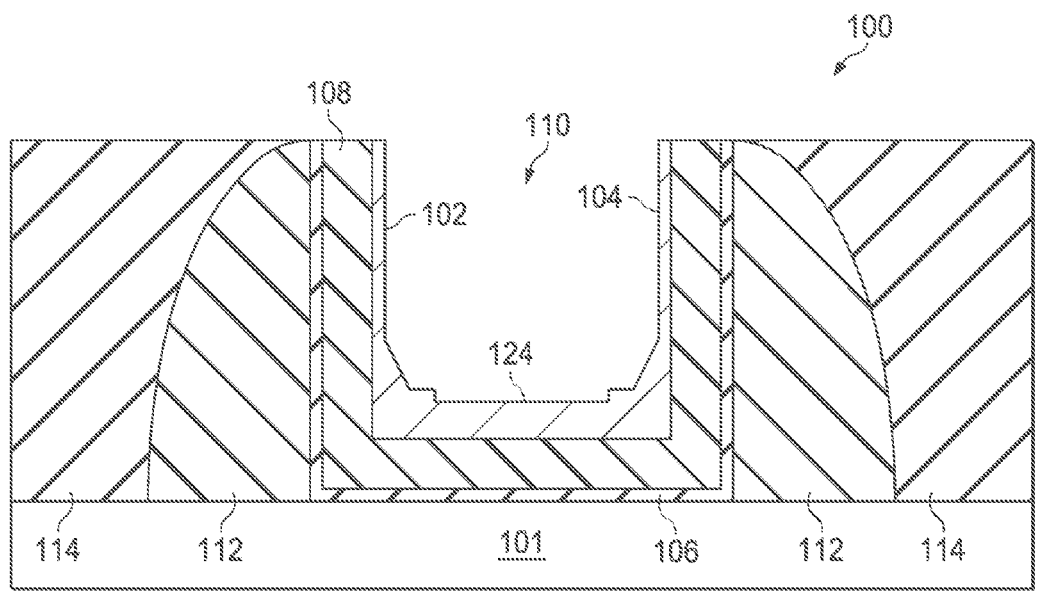
FIG. 1 illustrates a cross sectional view of a metal gate structure in accordance with an embodiment.

Referring initially to FIG. 1, a cross sectional view of a metal gate structure is illustrated in accordance with an embodiment. The metal gate structure 100 comprises a trench 110. The trench 110 has a first metal sidewall 102, a second metal sidewall 104 and a metal bottom layer 124. As shown in FIG. 1, the first metal sidewall 102, the second metal sidewall 104 and the metal bottom layer 124 may form a metal interior layer of the trench 110. The metal interior layer may be formed of titanium nitride, tantalum nitride, tungsten nitride, titanium, tantalum and/or combinations thereof. The metal interior layer may be formed by employing a physical vapor deposition (PVD) process. Alternatively, the metal interior layer may be formed by using a chemical vapor deposition (CVD) process or the like. Both the PVD process and the CVD process are known in the art, and hence are not discussed in further detail. In accordance with an embodiment, the first sidewall 102 and the second sidewall 104 may have a thickness less than 10 angstrom. The detailed fabrication procedures of forming the sidewalls 102, 104 will be discussed below with respect to FIGS. 2-5.

The metal interior layer is formed on a dielectric layer 108. The dielectric layer 108 may be formed by employing CVD or PVD processes. Alternatively, the dielectric layer 108 may be formed using an atomic layer deposition (ALD) process. The dielectric layer 108 may be formed of high-k dielectric materials. In one embodiment, the high-k dielectric material includes $HfO_2$. In another embodiment, the high-k dielectric material includes $Al_2O_3$. Alternatively, the high-k dielectric material layer includes metal nitrides, metal silicates and/or combinations thereof. In accordance with an embodiment, the dielectric layer 108 may have a thickness ranging from about 10 angstrom to about 35 angstrom.

The gate structure 100 may further comprise a barrier layer 106 formed between a substrate 101 and the dielectric layer 108. The barrier layer 106 may be formed by using suitable thermal treatment techniques, wet treatment techniques or deposition techniques such as PVD, CVD, ALD or the like. The barrier layer 106 may be formed of silicon oxide, silicon nitride, silicate based and the like. In accordance with an embodiment, the barrier layer 106 may have a thickness less that 15 angstrom.

The gate structure 100 may further comprise a plurality of gate spacers 112. The gate spacers 112 are used to isolate the metal gate structure from the adjacent semiconductor structures as well as for aligning subsequently formed source and drain regions. In accordance with an embodiment, the gate spacers 112 may be formed of silicon nitride. Alternatively, the gate spacer 112 may be formed of nitride or oxide based dielectric materials. The gate structure 100 shown in FIG. 1 further comprises an inter-layer dielectric (ILD) layer 114. The ILD layer 114 may be formed, for example, of a low-K dielectric material, such as silicon oxide, phosphosilicate glass (PSG), borophosphosilicate glass (BPSG), fluorinated silicate glass (FSG), $SiO_x$, $C_y$, Spin-On-Glass, Spin-On-Polymers, silicon carbon material, compounds thereof, composites thereof, combinations thereof or the like, by any suitable method known in the art, such as spin coating, CVD and the like.

Figure 2:
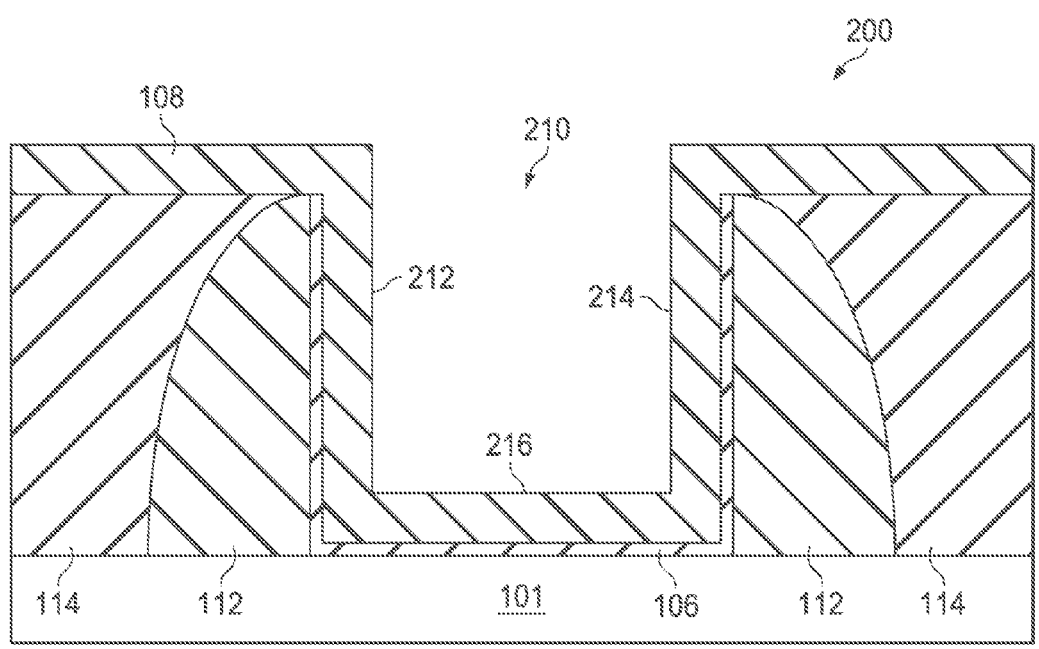
FIGS. 2-5 are cross sectional views of intermediate stages in the making of a metal gate structure in accordance with an embodiment.

FIGS. 2-5 are cross sectional views of intermediate stages in the making of a metal gate structure in accordance with an embodiment. As shown in FIG. 2, the gate structure 200 is similar to the gate structure 100 shown in FIG. 1 except that the interior metal layer is not formed on the dielectric layer 108 yet. As shown in FIG. 2, the dielectric layer 108 may be further divided into several portions depending on the location of each portion. The dielectric layer 108 may comprise a first dielectric sidewall 212, a second dielectric sidewall 214 and a dielectric bottom layer 216. In accordance with an embodiment, the first dielectric sidewall 212, the second dielectric sidewall 214 and the dielectric bottom layer 216 may be of the same thickness.

FIG. 2 shows that the metal layer is not coated on the dielectric layer 108. In accordance with an embodiment, the channel of a MOS device having the metal structure 200 may have a length of approximately 30 nm. Such a length makes the MOS device with the metal gate structure 200 fall into a MOS device category commonly referred to as short channel MOS devices. It should be noted that FIGS. 2-5 shows the advantageous features of making a thin metal layer, especially a thin sidewall of a metal gate structure for a short channel MOS device. The metal sidewall difference between a short channel MOS device and a long channel MOS device will be described in further detail with respect to FIG. 6.

Figure 3:
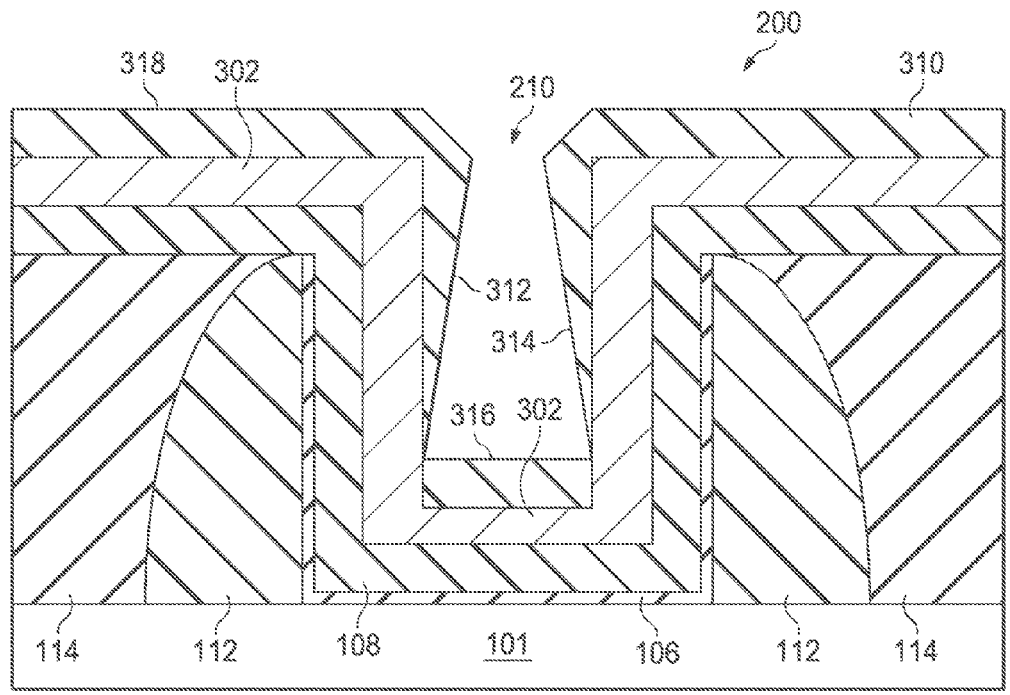

FIG. 3 illustrates a process of depositing a metal layer and a protection layer. A metal layer 302 is formed on the dielectric layer 108 using suitable deposition techniques such as ALD, CVD, PVD and the like. The above deposition techniques are well known in the art, and hence are not discussed herein. In accordance with an embodiment, the metal layer 302 is formed of titanium nitride, tantalum nitride, tungsten nitride, titanium, tantalum and/or combinations thereof. In accordance with an embodiment, the metal layer 302 may have a thickness of 20 angstrom.

Subsequently, a protection layer 310 is formed on the metal layer 302 using a PVD process. The protection layer 310 is formed of dielectric materials such as silicon, silicon dioxide or the like. Depending on the location, the protection layer 310 may be further divided into four portions, namely a top protection layer 318, a first sidewall protection layer 312, a second sidewall protection layer 314 and a bottom protection layer 316. In accordance with an embodiment, the bottom protection layer 316 may be of a thickness more than 15 angstrom. In contrast, the lower portions of both the first sidewall protection layer 312 and the second sidewall protection layer 314 may be of a thickness less than 20 angstrom.

In addition, The PVD process can create an uneven protection layer. As shown in FIG. 3, both the first sidewall protection layer 312 and the second sidewall protection layer 314 may be of an uneven thickness. More particularly, the upper portion of the sidewall protection layer (e.g., 312) is thicker than the lower portion of the sidewall protection layer (e.g., 312). It should be noted that one advantageous feature of using the PVD process is an uneven sidewall protection layer can be created. Moreover, by employing an etch-back process, the thin metal sidewall shown in FIG. 1 can be obtained. In addition, another advantageous feature of having an uneven protection layer on the metal layer 302 is that the thickness of the sidewalls of the metal gate structure 200 can be controlled by adjusting the thickness of the first sidewall protection layer 312 and the second sidewall protection layer 314. It should be noted that while FIG. 3 shows both the first sidewall protection layer 312 and the second sidewall protection layer 314 may be of the same thickness, a person skilled in the art will recognize that it is within the scope and spirit of various embodiments for both protection layers to comprise different thicknesses. Alternatively, the thickness of each sidewall could also be adjusted by using different etch-back processes.

Figure 4:
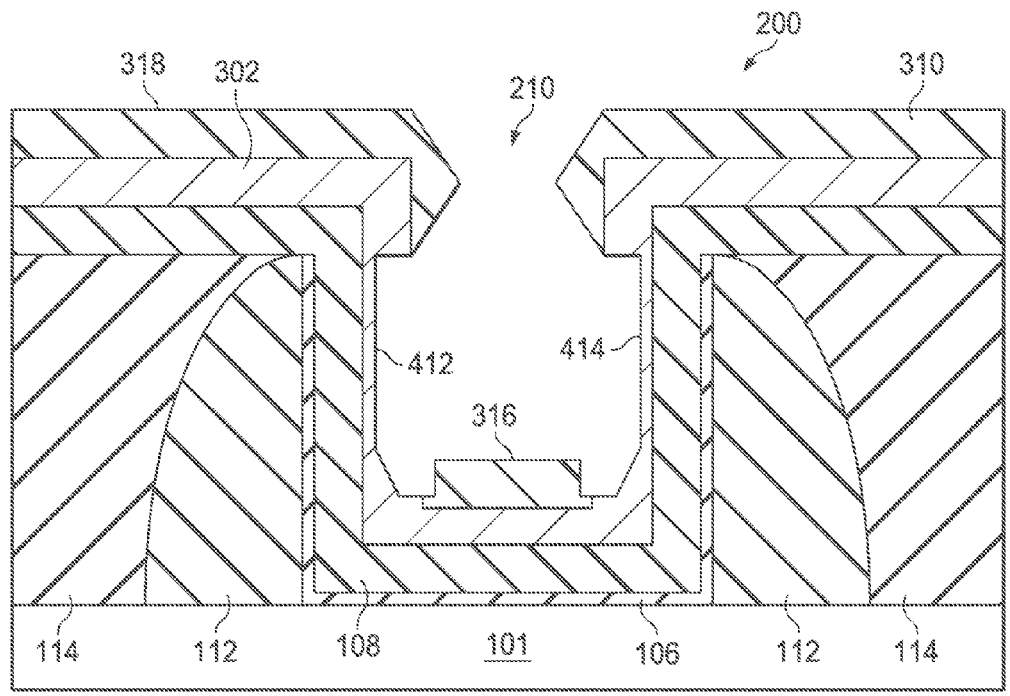

FIG. 4 illustrates an etch-back process in accordance with an embodiment. A suitable etching process such as wet-etching or dry-etching may be applied to the metal gate structure 200. The detailed operations of either the dry etching process or the wet etching process are well known, and hence are not discussed herein to avoid repetition. In accordance with an embodiment, an isotropic etching process is employed to perform the etch-back. The protection layer 310 may be etched back during the isotropic etching process. Because each portion of the protection layer 310 may have a different thickness and the isotropic etching etches equally in all directions, the thin portion such as the first sidewall protection layer 312 and the second sidewall protection layer 314 may be fully removed. As a result, both metal sidewalls are etched back subsequently, so that two thin metal sidewalls are formed. As shown in FIG. 4, the metal gate structure 200 may have thinner metal sidewalls in comparison with those shown in FIG. 3. In accordance with an embodiment, a first metal sidewall 412 and a second metal sidewall 414 may be of a thickness of approximately 10 angstrom.

FIG. 4 further shows the bottom protection layer 316 remains with a significant thickness after the etch-back process. Referring back to FIG. 3, the lower portions of the first sidewall protection layer 312 and the second sidewall protection layer 314 is thinner than the upper portions of the first sidewall protection layer 312 and the second sidewall protection layer 314. Therefore, the etchant may etch the lower portions first. The bottom protection layer 316 helps to prevent the etching process from removing the bottom metal layer. It should be noted that while FIG. 4 shows the remaining portion of the bottom protection layer 316 is drawn with sharp lines, a person having ordinary skill in the art will recognize that the isotopic etching process may produce a remaining portion with various rounded edges.

Figure 5:
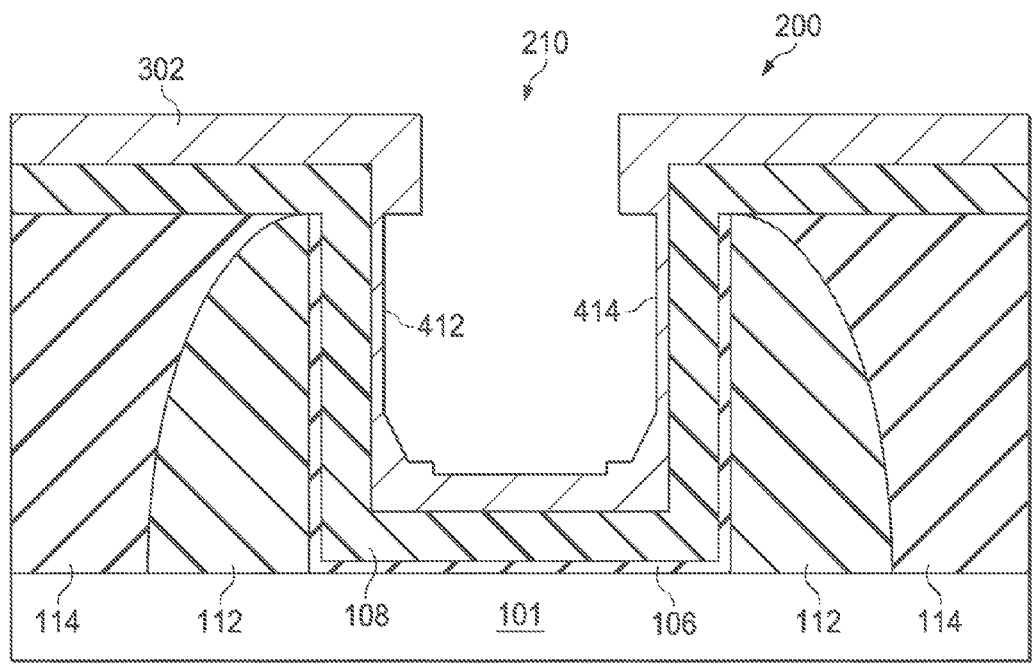

FIG. 5 illustrates a metal gate structure after removing the remaining bottom protection layer. The remaining bottom protection layer may be removed by a dry etching or a wet etching process. After removing the bottom protection layer, the metal gate structure 200 comprises the same metal gate structure as that shown in FIG. 1. An advantageous feature of having a remaining bottom protection layer is that a thin sidewall can be achieved during an etch-back process. Furthermore, the thin metal sidewalls (e.g., the first metal sidewall 412) allow extra space for a subsequent metal-fill process to fill the trench 210 of the metal gate structure 200.

Figure 6:
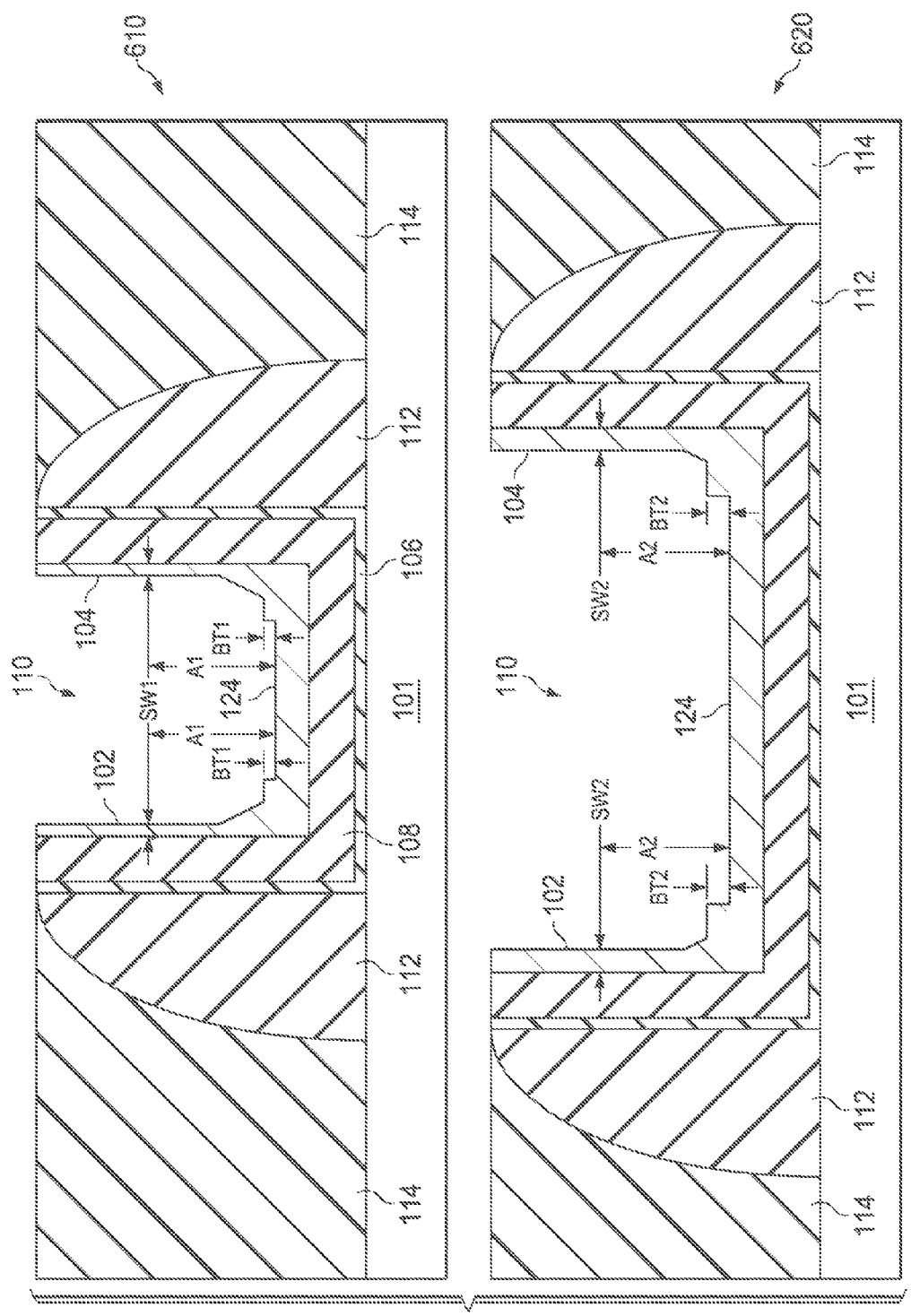
FIG. 6 illustrates the metal gate difference between a short channel MOS device and a long channel MOS device by employing the process described with respect to FIGS. 2-5.

FIG. 6 illustrates the metal gate difference between a short channel MOS device and a long channel MOS device by employing the process described with respect to FIGS. 2-5. As shown in FIG. 6, a short channel MOS device 610 and a long channel MOS device 620 may be of the same structure except that the channel length of the short channel MOS device 610 is less than that of the long channel MOS device 620. In accordance with an embodiment, the channel length of the short channel MOS device 610 is less than 30 nm. In contrast, the channel length of the long channel MOS device 620 is more than 250 nm.

Despite that the same fabrication process may be employed, some physical parameters of metal layers may be different for short channel MOS devices and long channel MOS devices. For example, by employing a PVD process, the thickness of the protection layer of the long channel MOS device 620 is thicker than that of the short channel MOS device. As a result, after an etch-back process is performed, less metal materials are left on the sidewall of the short channel MOS device 610 in comparison with that of the long channel MOS device 620. As shown in FIG. 6, the metal sidewall thicknesses of the short channel MOS device 610 and the long channel MOS device 620 are defined as SW1 and SW2 respectively. As shown in FIG. 6, SW1 is measured at a point A1 from the bottom of the metal layer. Similarly, SW2 is measured at a point A2 from the bottom of the metal layer. In accordance with an embodiment, A1 and A2 are approximately 50 angstrom. By employing the etch-back process illustrated in FIG. 4, SW2 is bigger than SW1. In accordance with an embodiment, SW1 is of a thickness less than 10 angstrom. In contrast, SW2 is of a thickness more than 15 angstrom. On the other hand, the plateau regions formed by removing the remaining bottom protection layer may be of a height BT1 and BT2 respectively. In accordance with an embodiment, BT1 is of a height ranging from about 5 angstrom to about 35 angstrom. In contrast, BT2 is of a height ranging from about 15 angstrom to about 40 angstrom. It should be noted that when a same fabrication process is employed, BT1 is less than BT2.

Figure 7:
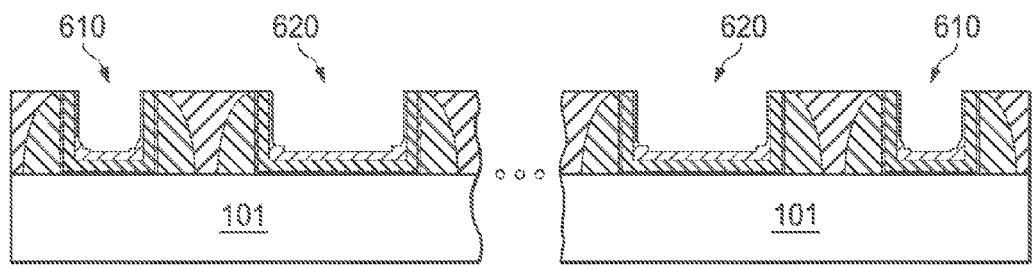
FIG. 7 illustrates a cross sectional view of a variety of MOS devices fabricated on a substrate in accordance with an embodiment.

FIG. 7 illustrates a cross sectional view of a variety of MOS devices fabricated on a substrate in accordance with an embodiment. On a substrate 101, there may be various MOS devices. The MOS devices may include a short channel MOS device 610 and long channel MOS device 620. As described above with respect to FIG. 6, after an etch-back process, the short channel MOS device 610 may have a thinner metal sidewall in comparison with that of the long channel MOS device 620, which is fabricated on the same substrate 101.

Although embodiments of the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method comprising:
   forming a first gate trench and a second gate trench over a substrate, wherein a width of the second gate trench is greater than a width of the first gate trench;
   forming a first dielectric layer in the first gate trench and a second dielectric layer in the second gate trench;
   depositing a first metal layer on the first dielectric layer and a second metal layer on the second dielectric layer;
   depositing a first protection layer on the first metal layer and a second protection layer on the second metal layer;
   performing an etch-back process on the first protection layer and the second protection layer to expose lower portions of sidewalls of the first metal layer and lower portions of sidewalls of the second metal layer; and
   removing a bottom portion of the first protection layer and a bottom portion of the second protection layer to form a first step and a second step in the first gate trench, and a third step and a fourth step in the second gate trench.

2. The method of claim 1, further comprising:
   a lower portion of a sidewall portion of the first protection layer is thinner than an upper portion of the sidewall portion of the first protection layer; and
   a lower portion of a sidewall portion of the second protection layer is thinner than an upper portion of the sidewall portion of the second protection layer.

3. The method of claim 1, further comprising:
   forming a first metal sidewall, a second metal sidewall and a first metal bottom layer in the first gate trench by performing the etch-back process; and
   forming a third metal sidewall, a fourth metal sidewall and a second metal bottom layer in the second gate trench by performing the etch-back process.

4. The method of claim 3, further comprising:
   forming a first corner portion between the first metal sidewall and the first metal bottom layer, wherein the first corner portion comprises the first step and a first ramp;
   forming a second corner portion between the second metal sidewall and the first metal bottom layer, wherein the second corner portion comprises the second step and a second ramp;
   forming a third corner portion between the third metal sidewall and the second metal bottom layer, wherein the third corner portion comprises the third step and a third ramp; and
   forming a fourth corner portion between the fourth metal sidewall and the second metal bottom layer, wherein the fourth corner portion comprises the fourth step and a fourth ramp.

5. The method of claim 4, wherein:
   a thickness of the third metal sidewall is greater than a thickness of the first metal sidewall.

6. The method of claim 4, wherein:
   a height of the third step is greater than a height of the first step.

7. A method comprising:
forming a gate trench over a substrate;
forming a dielectric layer on a bottom and sidewalls of the gate trench;
depositing a metal layer on the dielectric layer;
depositing a protection layer on the metal layer, wherein a sidewall portion of the protection layer has an uneven thickness;
applying an etch-back process to the protection layer until lower portions of sidewalls of the metal layer are exposed; and
after the lower portions of the sidewalls of the metal layer are exposed, removing a bottom portion of the protection layer to form a first step and a second step between a bottom and the sidewalls of the metal layer.

8. The method claim 7, further comprising:
forming a barrier layer between the substrate and the dielectric layer.

9. The method claim 8, wherein:
a thickness of the barrier layer is less than 15 Angstroms.

10. The method claim 7, wherein:
a thickness of a portion of the dielectric layer on the bottom of the gate trench is substantially equal to a thickness of a portion of the dielectric layer on a sidewall of the gate trench.

11. The method claim 7, further comprising:
depositing the protection layer on the metal layer using a plasma vapor deposition process.

12. The method claim 7, wherein:
an upper portion of the sidewall portion of the protection layer is thicker than a lower portion of the sidewall portion of the protection layer.

13. The method claim 7, wherein:
the etch-back process is an isotropic etching process.

14. A method comprising:
forming a gate trench over a substrate;
depositing a metal layer over a bottom and sidewalls of the gate trench;
depositing a protection layer on the metal layer, wherein an upper portion of a sidewall portion of the protection layer is thicker than a lower portion of the sidewall portion of the protection layer;
applying an etching process to the protection layer until lower portions of sidewalls of the metal layer are exposed; and
removing a remaining portion of the protection layer from the bottom of the gate trench, wherein after removing the remaining portion of the protection layer, a step is formed in an upper surface between a center region and a sidewall of the metal layer, and wherein a top surface of the step with reference to a bottom of the gate trench is higher than a top surface of the center region of the metal layer with reference to the bottom of the gate trench.

15. The method claim 14, further comprising:
forming a barrier layer over the bottom and sidewalls of the gate trench; and
forming a dielectric layer over the barrier layer, wherein the dielectric layer is between the metal layer and the substrate.

16. The method claim 15, wherein:
a thickness of a bottom portion of the dielectric layer is substantially equal to a thickness of a sidewall portion of the dielectric layer.

17. The method claim 14, wherein:
before applying the etching process to the protection layer, the metal layer has an even thickness.

18. The method claim 14, wherein:
the etching process is an isotropic etching process.

19. The method claim 14, wherein:
at least a portion of the remaining portion of the protection layer is embedded in the metal layer.

20. The method claim 14, wherein:
a width of the gate trench is approximately equal to 30 nm.

* * * * *